US008026720B1

(12) United States Patent
Chen et al.

(10) Patent No.: US 8,026,720 B1
(45) Date of Patent: Sep. 27, 2011

(54) RAPID AUTO-CALIBRATED PARALLEL RECONSTRUCTION USING SYNTHETIC TARGET COIL

(76) Inventors: Weitian Chen, Menlo Park, CA (US); Peng Hu, Quincy, MA (US); Craig H. Meyer, Charlottesville, VA (US)

( * ) Notice: Subject to any disclaimer, the term of this patent is extended or adjusted under 35 U.S.C. 154(b) by 268 days.

(21) Appl. No.: 12/411,110

(22) Filed: Mar. 25, 2009

Related U.S. Application Data

(60) Provisional application No. 61/039,240, filed on Mar. 25, 2008.

(51) Int. Cl.
*G01V 3/00* (2006.01)
(52) U.S. Cl. .................................................... 324/309
(58) Field of Classification Search ........... 324/300–322
See application file for complete search history.

(56) References Cited

U.S. PATENT DOCUMENTS

| 6,965,232 | B2 | 11/2005 | Sodickson |
| 7,202,663 | B2 | 4/2007 | Huang |
| 7,583,082 | B1 | 9/2009 | Hu et al. |
| 2007/0219740 | A1 | 9/2007 | Wilson et al. |

OTHER PUBLICATIONS

Hu, P. et al., "BOSCO: Parallel Image Reconstruction Based on Successive Convolution Operations," in Proceedings of the 15th Annual Meeting of ISMRM, Seattle, 2006, p. 10.
Heberlein, K. A., et al., "Segmented Spiral Parallel Imaging Using GRAPPA, "Proc. Intl. Soc. Mag. Reson. Med 11 (2004) p. 328.
J.D O'Sullivan, "A fast Sinc Function Gridding Algorithm for Fourier Inversion in Computer Tomography," Medical Imaging, IEEE Transactions on, vol. 4, No. 4, pp. 200-207, 1985.
C.T. Sica and C.H. Meyer, "Rapid Correction for Concomitant Gradient Field Effects in Spiral Scans," in Proceedings of the 11th Annual Meeting of ISMRM,Toronto, CO, 2003, p. 480.
B.P. Sutton, D.C. Noll, and J.A. Fessler, "Fast, Iterative Image Reconstruction for MRI in the Presence of Field in Homogeneities," Medical Imaging, IEEE Transactions on, vol. 22, No. 2, pp. 178-188, 2003.
R.M. Heidemann, M.A. Griswold, N. Seiberlich, G. Kruger, S.A. Kannengiesser, B. Kiefer, G.Wiggins, L.L. Wald, and P.M. Jakob, "Direct Parallel Image Reconstructions for Spiral Trajectories Using GRAPPA," Magnetic Resonance in Medicine, vol. 56, No. 2, pp. 317-326, Aug. 2006.
K. Heberleinand, X. Hu, "Auto-Calibrated Parallel Spiral Imaging," Magnetic Resonance in Medicine, vol. 55, No. 3, pp. 619-625, Mar. 2006.
V. Rasche, R. Proksa, R. Sinkus, P. Bornert, and H. Eggers, "Resampling of Data Be•tween Arbitrary Grids Using Convolutioninterpolation," Medical Imaging, IEEE Trans•actions on, vol. 18, No. 5, pp. 385-392, 1999.
M.A. Griswold, S. Kannengiesser, R.M. Heidemann, J. Wang, and P.M. Jakob, "Field of• View Limitations in Parallel Imaging," Magnetic Resonance in Medicine, vol. 52, No. 5, pp. 1118-1126, 2004.
E.N. Yeh, C.A. McKenzie, M.A. Ohliger, and D.K. Sodickson, "3 Parallel Magnetic Reso•nance Imaging with Adaptive Radius in K-Apace(PARS): Constrained Image Reconstruc•tion Using K-Space Locality in Radiofrequency Coil Encoded Data," Magnetic Resonance in Medicine, vol. 53, No. 6, pp. 1383-1392, 2005.

(Continued)

*Primary Examiner* — Dixomara Vargas
(74) *Attorney, Agent, or Firm* — Blank Rome LLP

(57) ABSTRACT

In a rapid auto-calibrated partially parallel reconstruction method, the unaliasing process is approached by convolution. The image combination is performed on a low-resolution image matrix before unaliasing, and the unaliasing process is effectively performed once for a single synthetic target coil instead of for each individual coil.

26 Claims, 10 Drawing Sheets

OTHER PUBLICATIONS

C. Liu, R. Bammer, and M.E. Moseley, "Parallel Imaging Reconstruction for Arbitrary Trajectories Using K-Space Sparse Matrices (kSPA).," Magnetic Resonance in Medicine, vol. 58, No. 6, pp. 1171-1181, 2007.

A. A. Samsonov, W.F. Block, A. Arunachalam, and A.S. Field, "Advances in Locally Constrained K-Space-Based Parallel MRI," Magnetic Resonance in Medicine, vol. 55, No. 2, pp. 431-438, Feb. 2006.

M.A. Griswold, R.M. Heidemann, and P.M. Jakob, "Direct Parallel Imaging Reconstruc•tion of Radially Sampled Data Using GRAPPA with Relative Shifts," in Proceedings of the 11th Annual Meeting of ISMRM, Toronto, 2003, p. 2349.

F. Huang, S. Vijayakumar, Y. Li, S. Hertel, S. Reza, and G.R Duensing, "Self-Calibration Method for Radial GRAPPA/kt GRAPPA.," Magnetic Resonance in Medicine,, vol. 57, No. 6, pp. 1075-1085, 2007.

P.M. Jakob, M.A. Griswold, R.R. Edelman, and D.K. Sodickson, "Auto-Smash: A Self-Calibrated Technique for SMASH Imaging," MAGMA, vol. 7, No. 1, pp. 42-54, Nov. 1998.

R.M. Heidemann, M.A. Griswold, A. Haase, and P.M. Jakob, "VD-Auto-Smash Ima•ing," Magnetic Resonance in Medicine, vol. 45, No. 6, pp. 1066-1074, 2001.

P.J. Beatty and A.C. Brau, "Uniform Virtual Coil Reconstruction for Autocalibrating Parallel Imaging," in Proceedings of the 15th Annual Meeting of ISMRM, Berlin, May 2007, p. 1751.

J.R. Porter, S.M. Wright, and A. Reykowski, "A 16-Element Phased-Array Head Coil," Magnetic Resonance in Medicine,, vol. 40, No. 2, pp. 272-279, 1998.

Y. Zhu, C.J. Hardy, D.K. Sodickson, R.O. Giaquinto, C.L. Dumoulin, G. Kenwood, T. Nien•dorf, H. Lejay, C.A. McKenzie, and M.A. Ohliger, "Highly Parallel Volumetric Imaging with a 32-Element RF Coil Array," Magnetic Resonance in Medicine, vol. 52, No. 4, pp. 869-877, 2004.

M.P. McDougall and S.M. Wright, "64-Channel Array Coil for Single Echo Acquisition Magnetic Resonance Imaging," Magnetic Resonance in Medicine,, vol. 54, No. 2, pp. 386-392, Aug. 2005.

L. L. Wald, "Parallel Imaging Update: How Many Elements do We Need?," in Proceed•ings of the 14th Annual Meeting of ISMRM, Seattle,WA,May 2006,p. 202.

B. Zhang, J. Wang, K. Zhong, and Y. Zhuo, "K-Space SENSE Reconstruction," in Proceedings of the 13th Annual Meeting of ISMRM, Miami,WA,May 2005,p. 2257.

M. Buehrer, K.P. Pruessmann, P. Boesiger, and S. Kozerke, "Array Compression for MRI With Large Coil Arrays," Magnetic Resonance in Medicine,, vol. 57, No. 6, pp. 1131-1139, 2007.

M.A. Griswold, F. Breuer, M. Blaimer, S. Kannengiesser, R.M. Heidemann, M. Mueller, M. Nittka,V. Jellus, B. Kiefer, and P.M. Jakob, "Autocalibrated Coil Sensitivity Esti•mation for Parallel Imaging," NMR Biomed, vol. 19, No. 3, pp. 316-324, May 2006.

J. Wang, B. Zhang, K. Zhong, and Y. Zhuo, "Image Domain Basedfast GRAPPA Re•construction and Relative SNR Degradation Factor,"in Proceedings of the 13th Annual Meeting of ISMRM, 2005, p. 2428.

P.B. Roemer, W.A. Edelstein, C.E. Hayes, S.P. Souza, and O.M. Mueller, "The NMR Phased Array," Magnetic Resonance in Medicine, vol. 16, No. 2, pp. 192-225, Nov. 1990.

D.O. Walsh, A.F. Gmitro, and M.W. Marcellin, "Adaptive Reconstruction of Phased Array MR Imagery," Magnetic Resonance in Medicine,, vol. 43, No. 5, pp. 682-690, May 2000.

M.A. Griswold, D.O. Walsh, R.M Heidemann,A. Haase, and P.M. Jakob, "The Use of an Adaptive Reconstruction for Array Coil Sensitivity Mapping and Intensity Normal•ization," in Proceedings of the 12th Annual Meeting of ISMRM, Honolulu, 2002, p. 2410.

D.K. Sodickson and W.J. Manning, "Simultaneous Acquisition of Spatial Harmonics (SMASH): Fast Imaging with Radiofrequency Coil Arrays.," Magnetic Resonance in Medicine,, vol. 38, No. 4, pp. 591-603, 1997.

Y. Li, S. Vijayakumar, and F. Huang, "Reconstruction in Image Space Using Basis Functions (RIB): eigenmode analysis," in Proceedings of the 15th Annual Meeting of ISMRM, 2007, p. 146.

W. Chen and C.H. Meyer, "Off-resonance Correction for 3D Imaging Using a Stack of Spirals Trajectory," in Proceedings of the 14th Annual Meeting of ISMRM, Seattle, May 2006, p. 2966.

P. Gumey, Magnetic Resonance Imaging using a 3D cones k-space trajectory, PhD Thesis, Stanford Univeristy, 2007.

K.S. Nayak, B.A. Hargreaves, B.S. Hu, D.G. Nishimura, J.M. Pauly, and C.H. Meyer, "Spiral Balanced Steady-State Free Precession Cardiac Imaging," Magnetic Resonance in Medicine,, vol. 53, No. 6, pp. 1468-1473, Jun. 2005.

W. Block, J. M. Pauly,and D.G. Nishimura, "RARE Spiral T2-Weighted Imaging.," Magnetic Resonance in Medicine,, vol. 37, No. 4, pp. 582-590, 1997.

H. Moriguchi, J.S. Lewin, and J.L. Duerk, "Dixon Techniques in Spiral Trajectories with Off-Resonance Correction: A New Approach for Fat Suppression Without Spatial-Spectral RF Pulses," Magnetic Resonance in Medicine,, vol. 50, No. 5, pp. 915-924, Nov. 2003.

C.B. Ahn, J.H. Kim, and Z.H. Cho, "High-speed spiral-scan echo planar NMR imaging- I.," IEEE Trans. Med. Imag., vol. 5, No. 1, pp. 2-7, 1986.

C.H Meyer, B. Hu, D.G. Nishimura, and A. Macovski, "FastSpiral CoronaryArtery Imaging," Magnetic Resonance in Medicine vol. 28, No. 2, pp. 202-213, Dec. 1992.

K.P. Pruessmann, M. Weiger, M.B. Scheidegger, and P. Boesiger, "SENSE: Sensitivity Encoding for fast MRI," Magnetic Resonance in Medicine vol. 42, No. 5, pp. 952-962, Nov. 1999, Comparative Study.

M.A. Griswold, P.M.Jakob, R.M Heidemann, M. Nittka, V. Jellus, J. Wang, B. Kiefer, and A Haase, "Generalized Autocalibrating Partially Parallel Acquisitions (GRAPPA)," MMagnetic Resonance in Medicine, vol. 47, No. 6, pp. 1202-1210, Jun. 2002.

A. Macovski, "Volumetric NMR Imaging with Time-Varying Gradients," Resonance in Medicine, vol. 2, No. 1, pp. 29-40, Feb. 1985.

K.P Pruessmann, M. Weiger, P. Bornert, and . P Boesiger, "Advances in Sensitivity Encoding With Arbitrary K-Space Trajectories," MMagnetic Resonance in Medicine, vol. 46, No. 4, pp. 638-651, Oct. 2001.

C. Barmet, J. Tsao, and K.P Pruessmann, "Sensitivity encoding and B0 in homogeneity—A simultaneous reconstruction," in Proceedings of the 14th Annual Meeting of ISMRM, Seattle, 2005, p. 682.

C. Barmet, J. Tsao, and K.P. Pruessmann, "Efficient iterative reconstruction for MRI in trongly in homogeneous Bo," in Proceedings of the 13th Annual Meeting of ISMRM, Miami, 2004, p. 347.

P. Hu and C.H. Meyer, "BOSCO: Parallel Image Reconstruction Based on Successive Convolution Operations," in Proceedings of the 14th Annual Meeting of ISMRM,Seat•tle, 2006, p. 10.

C.M Tsai and D.G Nishimura, "Reduced Aliasing Artifacts Using Variable-Density K-Space Sampling Trajectories," Magnetic Resonance in Medicine, vol. 43, No. 3, pp. 452-458, Mar. 2000.

D. M Spielman, J.M. Pauly, and C.H Meyer, "Magnetic Resonance Fluoroscopy Using Spirals with Variable Sampling Densities," MMagnetic Resonance in Medicine, vol. 34, No. 3, pp. 388-394, Sep. 1995.

K.S Nayak, C.M Tsai, C.H Meyer, and D.G Nishimura, "Efficient Off-Resonance Correc•tion for Spiral Imaging," Magnetic Resonance in Medicine, vol. 45, No. 3, pp. 521-524, Mar. 2001.

C. Liu, R. Bammer, D. Kim, and M.E. Moseley, "Self-navigated Interleaved Spiral(SNAILS): Application to High-Resolution Diffusion Tensor Imaging," Magnetic Resonance in Medicine, vol. 52, No. 6, pp. 1388-1396, 2004.

C.H. Meyer, J.M. Pauly, A. Macovski, and D.G. Nishimura, "Simultaneous Spatial and Spectral Selective Excitation," Magnetic Resonance in Medicine, vol. 15, No. 2, pp. 287-304, Aug. 1990.

D.G. Norris, "Phase Errors in NMR Images," in Proceedings of the 4th Annual Meeting of ISMRM, London, May 1985, p. 1037.

K. Sekihara, M.Kuroda, and H. Kohno, "Image restoration from non-uniform magnetic field influence for direct Fourier NMR imaging.," Physics in Medicine & Biology,vol. 29, No. 1, pp. 15-24, 1984.

Z.H. Cho, D.J. Kim, and Y.K. Kim, "Total inhomogeneity correction including chemical shifts and susceptibility by view angle tilting," Medical Physics, vol. 15, p. 7, 1988.

H. Chang and J.M. Fitzpatrick, "A Technique for Accurate Magnetic Resonance Imaging in the Presence of Field Inhomogeneities," Medical Imaging, IEEE Transactions on, vol. 11, No. 3, pp. 319-329, 1992.

M. O'Donnell and W.A. Edelstein, "NMR imaging the presence of magnetic field inhomogeneities and gradient field nonlinearities," Medical Physics, vol. 12, p. 20, 1985.

E. Yudilevich and H. Stark, "Spiral Sampling in Magnetic Resonance Imaging-The effect of Inhomogeneities," Medical Imaging, IEEE Transactions on, vol. 6, No. 4, pp. 337-345, 1987.

P. Irarrazabal, C.H. Meyer, D.G. Nishimura, and A. Macovski, "Inhomogeneity Correction Using an Estimated Linear Field Map.," Magn Reson Med, vol. 35, No. 2, pp. 278-282, 1996.

D.C. Noll, C.H. Meyer, J.M. Pauly, D.G. Nishimura, and A. Macovski, "A Homogene•ity Correction Method for Magnetic Resonance Imaging With time Varying Gradients," Medical Imaging, IEEE Transactions on, vol. 10, No. 4, pp. 629-637, 1991.

D.C Noll, Reconstruction techniques for magnetic resonance imaging, PhD Thesis, Stanford University, 1991.

H. Schomberg, "Off-Resonance Correction of MR images," Medical Imaging, IEEE Transactions on, vol. 18, No. 6, pp. 481-495, 1999.

Y.M. Kadah and X. Hu, "Simulated Phase Evolution Rewinding (SPHERE):A Technique for Reducing B0 Inhomogeneity Effects in MR images," Magnetic Resonance in Medicine, vol. 38, No. 4, pp. 615-627, 1997.

L.C. Man, J.M. Pauly, and A. Macovski, "Multifrequency Interpolation for Fast Off Resonance Correction.," Magnetic Resonance in Medicine, vol. 37, No. 5, pp. 785-792, 1997.

H. Moriguchi, B.M. Dale, J.S. Lewin and J.L. Duerk, "Block Regional Off-Resonance Cor•rection (BRORC): A Fast and Effective Deblurring Method for Spiral Imaging," vol. 50, No. 3, pp. 643-648, Sep. 2003.

E. Ahunbay and J.G. Pipe, "Rapid Method for Deblurring Spiral MR Images," Magnetic Resonance in Medicine, vol. 44, No. 3, pp. 491-494, Sep. 2000.

Y.M. Kadah and X. Hu, "Algebraic Reconstruction for Magnetic Resonance Imaging Under B0 Inhomogeneity," Medical Imaging, IEEE Transactions on, vol. 17, No. 3, pp. 362-370, 1998.

T.B. Harshbarger and D.B. Twieg, "Iterative Reconstruction of Single-Shot Spiral MRI With Off Resonance," Medical Imaging, IEEE Transactions on, vol. 18, No. 3, pp. 196-205, 1999.

B.P. Sutton, D.C. Noll, and J.A. Fessler, "Fast, Iterative Image Reconstruction for MRI in the Presence of Field Inhomogeneities," Medical Imaging, IEEE Transactions on, vol. 22, No. 2, pp. 178-188, 2003.

D.C. Noll, J.A. Fessler, and B.P. Sutton, "Conjugate Phase MRI Reconstruction With Spatially Variant Sample Density Correction," Medical Imaging, IEEE Transactions on, vol. 24, No. 3, pp. 325-336, 2005.

W. Chen, C.T. Sica, and C.H. Meyer, "Fast Conjugate Phase Reconstruction Based on Polynomial Approximations," in Proceedings of the 15th Annual Meeting of ISMRM, Berlin, 2007, p. 148.

S.J. Norton, "Fast Magnetic Resonance Imaging With Simultaneously Oscillating and Rotating Field Gradients," vol. 6, pp. 21-31, 1987.

A. Maeda, K. Sano, and T. Yokoyama, "Reconstruction by Weighted Correlation for MRI With Time-Varying Gradients," vol. 7, pp. 26-31, 1988.

J.I. Jackson, C.H. Meyer, D.G. Nishimura, and A. Macovski, "Selection of a Convolution Function for Fourier Inversion Using Gridding," Medical Imaging, IEEE Transactions on, vol. 10, No. 3, pp. 473-478, Sep. 1991.

W.H. Press, S.A. Teukolsky, W.T. Vetterling, and B.P. Flannery, Numerical recipes in C, Cambridge University Press Cambridge, 1992.

G.H. Glover and C.S. Law, "Spiral-in/out BOLD fMRI for Increased SNR and Reduced Susceptibility Artifacts," Magnetic Resonance in Medicine, vol. 46, No. 3, pp. 515-522, 2001.

Y. Yang, H. Gu, W. Zhan, S. Xu, D.A. Silbersweig, and E. Stern, "Simultaneous Per•fusion and BOLD Imaging Using Reverse Spiral Scanning at 3T: Characterization of Functional Contrast and Susceptibility Artifacts," Magnetic Resonance in Medicine, vol. 48, No. 2, pp. 278-289, 2002.

D.C. Noll, J.M. Pauly, C.H. Meyer, D.G. Nishimura, and A. Macovski, "Deblurring for Non-2D Fourier Transform Magnetic Resonance Imaging," Magnetic Resonance in Medicine, vol. 25, No. 2, pp. 319-333, Jun. 1992.

L.C. Man, J.M. Pauly, and A. Macovski, "Improved Automatic Off-Resonance Correction Without a Field Map in Spiral Imaging," Magnetic Resonance in Medicine, ,vol. 37, No. 6, pp. 906-913, Dec. 1997.

W. Chen and C.H. Meyer, "Fast Automatic Linear Off-Resonance Correction Method for Spiral Imaging," Magnetic Resonance in Medicine, vol. 56, No. 2, pp. 457-462, Aug. 2006.

K.S. Nayak and D.G. Nishimura, "Automatic Field Map Generation and Off-Resonance Correction for Projection Reconstruction Imaging," Magnetic Resonance in Medicine, vol. 43, No. 1, pp. 151-154, Jan. 2000.

B.P. Sutton, D.C. Noll, and J.A. Fessler, "Dynamic Field Map Estimation Using a Spiral-In/Spiral-Out Acquisition," Magnetic Resonance in Medicine, vol. 51, No. 6, pp. 1194-1204, Jun. 2004.

T. Gerard, L. Pat, A.B Kerr, D.G. Nishimura,"Inhomogeneity Correction for Echo-Planar Imaging with a Polynomial Estimate of the Field Map," in Proceedings of the 3rd Annual Meeting of SMR, Nice, 1995, p. 617.

D.C. Noll, D.G. Nishimura, and A. Macovski, "Homodyne Detection in Magnetic Resonance Imaging," Medical Imaging, IEEE Transactions on,vol. 10, No. 2,pp. 154-163, 1991.

W.T. Wang ,P. Hu, and C.H. Meyer, "Estimating the Spatial Resolution of in Vivo Mag•netic Resonance Images Using Radiofrequency Tagging Pulses.," Magnetic Resonance in Medicine, vol. 58, No. 1, pp. 190-199, 2007.

H. Tanand, C.H. Meyer, "K-Space Trajectory Estimation in Spiral Imaging," in Proceed•ings of the 15th Annual Meeting of ISMRM, Berlin, 2007, p. 981.

K.F. King, A. Ganin, X.J. Zhou, and M.A. Bernstein, "Concomitant Gradient Field Effects in Spiral Scans," Magnetic Resonance in Medicine, vol. 41, No. 1, pp. 103-112, 1999.

K.F. King, "Spiral Scanning With Anisotropic Field of View," Magnetic Resonance in Medicine, vol. 39, No. 3, pp. 448-456, Mar. 1998.

RAPID AUTO-CALIBRATED PARALLEL RECONSTRUCTION USING SYNTHETIC TARGET COIL

REFERENCE TO RELATED APPLICATION

The present application claims the benefit of U.S. Provisional Application No. 61/039,240, filed Mar. 25, 2008, whose disclosure is hereby incorporated by reference in its entirety into the present disclosure.

STATEMENT OF GOVERNMENT INTEREST

This invention was made with government support under Contract No. HL079110 awarded by the National Institutes of Health. The government has certain rights in the invention.

FIELD OF THE INVENTION

The present invention is directed to image reconstruction and more particularly to image reconstruction by generating an unaliased data set corresponding to a synthetic (i.e., virtual) coil.

DESCRIPTION OF RELATED ART

Parallel imaging revolutionizes data acquisition in magnetic resonance imaging. SENSE is a well known image-domain-based parallel reconstruction method which is optimum in terms of SNR of the reconstructed image. However, SENSE requires knowledge of accurate RF coil sensitivity maps. Artifacts can appear if the estimated sensitivity profile is wrong.

GRAPPA is a coil-by-coil autocalibrated parallel reconstruction method. It has been shown that GRAPPA can achieve good image quality and suppress residual aliasing artifacts even when coil sensitivity profiles are difficult to acquire.

Parallel imaging can also be combined with non-Cartesian k-space sampling to achieve further scan time reduction or reduce image artifacts. Iterative SENSE reconstruction is effective in non-Cartesian parallel imaging but computation and memory intensive. GRAPPA has also been extended to non-Cartesian parallel imaging. These methods inherit the advantages of GRAPPA in Cartesian k-space sampling. Recently, Hu et al reported a GRAPPA-type autocalibrated partially parallel reconstruction method termed BOSCO which was successfully applied to spiral parallel imaging. BOSCO is described in U.S. patent application Ser. No. 11/785,734, filed Apr. 19, 2007, whose disclosure is hereby incorporated by reference in its entirety into the present disclosure. Similarly to GRAPPA, the unaliasing process in BOSCO is also carried out as a convolution operation. This process is performed coil-by-coil, and the final image is the combination of the unaliased coil images.

The coil-by-coil reconstruction was proposed in original GRAPPA largely because of its greater robustness to the phase cancellation problem compared to single coil autocalibrated approaches. However, coil-by-coil reconstruction has a computational disadvantage when a large number of coils are used for parallel imaging, since its reconstruction time grows as a square of the number of coils. Recently, the advance of hardware has permitted the application of large coil arrays having up to 128 receiver channels for improved performance of parallel imaging. The problem of computational load and memory limitations in image reconstruction due to the increased number of receiver channels has emerged.

SUMMARY OF THE INVENTION

It is therefore an object of the invention to address the problem of computational and memory limitations in image reconstruction due to the increased number of receiver channels.

To achieve the above and other objects, the present invention is directed to a new rapid auto-calibrated partially parallel reconstruction method. Similarly to GRAPPA-type reconstruction methods, the unaliasing process is performed by convolution. However, the image combination can be performed on a low-resolution image matrix before unaliasing, and the unaliasing process can be effectively performed once for a single synthetic target coil instead of for each individual coil, which results in significant computation reduction when a large number of receiver channels are used for data acquisition. Throughout the present specification, "low-resolution" should be construed to mean having a lower resolution than the image to be ultimately generated.

Compared to the existing partially parallel reconstruction methods, the main advantage of the present invention is its computational efficiency when a large number of receiver channels are used for data acquisition. In the present invention, the image combination is performed rapidly on a small matrix prior to the training and the unaliasing process, and the training and the unaliasing convolution only need to be performed once. By contrast, in GRAPPA and BOSCO, the training and the unaliasing process are performed for each individual component coil, and the final image combination is performed on a full resolution matrix size.

Currently a major limitation to non-Cartesian parallel imaging is its computational and memory intensity. BOSCO is a non-iterative k-space based non-Cartesian parallel imaging method. Therefore, it has a significant computational advantage compared to the iterative reconstruction methods, such as SENSE. However, the computational load of BOSCO is proportional to the number of receiver channels used for data acquisition. With the tendency to increase receiver channels in MRI systems for parallel imaging, BOSCO can become impractical for certain applications when computational time is critical, such as non-Cartesian real time imaging, without installing dedicated computational hardware. The present invention is expected to be a useful tool in such applications.

GRAPPA is an extension of AUTO-SMASH and VD-AUTO-SMASH. In AUTO-SMASH and VD-AUTO-SMASH, as well as the original SMASH technique, composite fully sampled low frequency k-space lines are formed for the data fitting. These composite k-space lines are usually the simple sum of the auto-calibration signal (ACS) lines acquired in each coil with phase calibration prior to summation, which results in problems of SNR degradation and phase cancellation in reconstructed images. In GRAPPA, this problem is addressed by performing unaliasing on each coil and forming the final image by combining individual unaliased coil images. By contrast, in the present invention, the problem is approached by forming a composite full FOV image prior to the unaliasing process, and the unaliasing is performed on a single synthetic (virtual) coil.

The unaliasing process in the present invention can be performed either in the image domain or the k-space domain. When performed in the image domain, the present invention can be combined with RIB reconstruction for region-by-region parallel reconstruction, which provides the advantage to optimize the reconstruction within an arbitrary region in image space. A certain choice of the basis functions and the size of region of interest can have advantages in particular applications. A preferred embodiment is disclosed herein using Fourier harmonics as basis function and full FOV as the region of interest when performing the process in the image domain.

The present invention provides a rapid, partially parallel reconstruction method for arbitrary k-space trajectories. This method is based on the principle that the unaliasing process in parallel imaging can be carried out by convolution with small kernels in k-space, as demonstrated by GRAPPA for Cartesian k-space sampling and BOSCO for non-Cartesian k-space sampling. In contrast to GRAPPA and BOSCO, in the present invention, the image combination is performed before the unaliasing process on a low resolution image matrix, and the unaliasing is performed only for a single synthetic target coil, which renders a significant computational advantage when a large number of receiver channels are used for data acquisition.

BRIEF DESCRIPTION OF THE DRAWINGS

A preferred embodiment of the present invention will be set forth in detail with reference to the drawings, in which.

DETAILED DESCRIPTION OF THE PREFERRED EMBODIMENT

Figure 1:
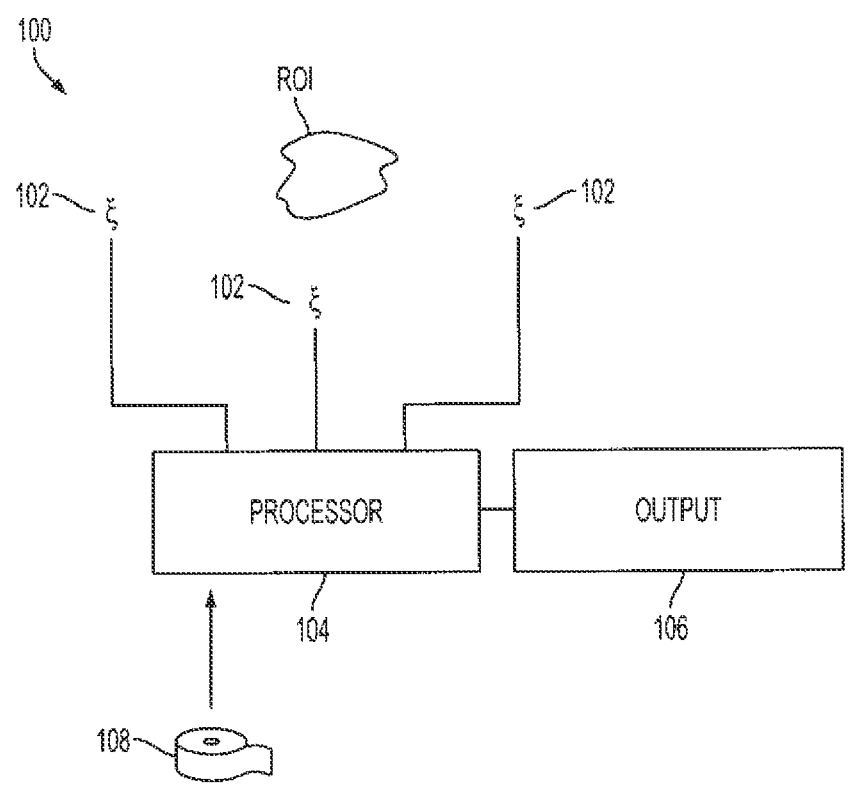
FIG. 1 is a schematic diagram showing an example of hardware on which the preferred embodiment can be implemented.

A preferred embodiment of the present invention will be set forth in detail with reference to the drawings, in which like reference numerals refer to like elements or method steps throughout.

The original GRAPPA reconstruction method reconstructs the missing k-space lines by a linear combination of the neighboring acquired lines. Mathematically, this reconstruction process can be viewed as a convolution in k-space. Consequently, the unaliasing process for an individual coil can be expressed as:

$$M_j(k) = \sum_{i=1}^{N_c} H_i^j(k) * \tilde{M}_i(k), \quad j = 1, 2, \ldots N_c \quad (1)$$

where $N_c$ is the number of coils, $M_j(k)$ is the k-space data of the jth coil after unaliasing, $\tilde{M}_i(k)$ is the under-sampled k-space data for the ith coil, and $H_i^j(k)$ are the convolution kernels which usually have a small matrix size. In the original GRAPPA reconstruction, the center element of these convolution kernels is constrained to be 1.

Based on Fourier transform theory, a convolution in k-space is equivalent to a multiplication in the image domain. Therefore, we can describe GRAPPA in the image domain as follows:

$$m_j(r) = \sum_{i=1}^{N_c} h_i^j(r)\tilde{m}_i(r), \quad j = 1, 2, \ldots N_c \quad (2)$$

where $m_j(r)$ is the unaliased image of the jth coil, $\tilde{m}_i(r)$ is the aliased image of the ith coil, and $h_i^j(r)$ are spatial weighting functions which are the Fourier transform of the convolution kernels. Since the convolution kernels usually consist only of low-frequency components, these weighting functions are smooth in the spatial domain.

After the unaliasing process, the final composite image can be formed using conventional phased array reconstruction methods. Typically, the reconstruction process can be expressed as a pixel-by-pixel linear combination of individual coil images:

$$m_0(r) = \sum_{j=1}^{N_c} w_j^*(r) m_j(r) \quad (3)$$

where $w_j(r)$ are the smooth spatial weighting coefficients for the jth coil and $w_j^*(r)$ are their conjugates. To maximize the SNR in the resulting image, the vector of weighting coefficients, $w = [w_1, w_2, \ldots w_{N_c}]$ at each pixel is given by:

$$w = \alpha R_n^{-1} c \quad (4)$$

where the vector $c = [c_1, c_2, \ldots c_{N_c}]$ is the sensitivity map at that pixel, $R_n^{-1}$ is the $N_c \times N_c$ coil correlation matrix, and $\alpha$ is an optional scaling vector at that pixel location.

Eq. (4) involves the calculation of the sensitivity maps. A number of methods are available for calculating sensitivity maps from fully sampled low-frequency k-space. In certain applications, the actual coil sensitivity can be difficult to determine. In one known adaptive reconstruction method for SNR optimization in phased array imaging without knowing the actual coil sensitivity, the array measurement is considered to consist of a desired stochastic signal process and an undesired stochastic noise process. The array correlation matrix for the signal process and noise process is estimated by averaging measured individual image cross-products over a local region:

$$R_s(j, k) = \sum_{SROI} m_j(r) m_k^*(r) \quad j, k = 1, 2 \ldots N_c \quad (5)$$

$$R_n(j, k) = \sum_{NROI} m_j(r) m_k^*(r) \quad j, k = 1, 2 \ldots N_c \quad (6)$$

where $m_i(r)$, $i=1, 2 \ldots N_c$ are individual coil images, and SROI and NROI are specified sets of pixel coordinates for estimating $R_s$ and $R_n$, respectively.

To reconstruct the final composite image, the array combination coefficients $w=[w_1, w_2, \ldots w_{N_c}]$ are calculated as the eigenvectors corresponding to the maximum eigenvalue of $$P = R_n^{-1} R_s \quad (7)$$

The coefficients may have rapid phase variations. In order to generate smooth combination coefficients, we can modulate the phase of all the coils by the phase of a single coil of the array.

We can combine Eq. (2) and Eq. (3) as follows to facilitate the computation:

$$m_0(r) = \sum_{i=1}^{N_c} u_i(r) \tilde{m}_i(r) \quad (8)$$

where $$u_i(r) = \sum_{j=1}^{N_c} w_j^*(r) h_i^{(j)}(r) \quad (9)$$

Since both $w_j(r)$ and $h_i^{(j)}$ vary slowly in space, the weighting function $u_i(r)$ should also be smooth in space, which corresponds to small kernels in k-space.

Eq. (8) indicates that the final full FOV (field-of-view) composite image is a linear combination of aliased coil images. To determine the weighting coefficients, additional auto-calibration signal (ACS) lines are collected, as in the original GRAPPA and the other auto-calibrating parallel imaging methods. The weighting coefficients can be determined either in k-space or in image space based on the minimization of a least square norm. In the image domain, this least square norm can be expressed as:

$$\left\| m_{0,t}(r) - \sum_{i=1}^{N_c} u_i(r) \tilde{m}_{i,t}(r) \right\|^2, \quad (10)$$

where $m_{0,t}(r)$ is a composite full-FOV low-resolution image, and $\tilde{m}_{i,t}(r)$ are aliased low-resolution images from each individual coil. $m_{0,t}(r)$ can be reconstructed by combining full-FOV low-resolution coil images based on Eq. (3). Regularization can be added to Eq. (10) to increase the SNR of the final reconstructed image with a tradeoff of increased aliasing energy.

When solving Eq. (10) in the image domain, we can express the weighting functions $u_i(r)$ as linear combinations of a finite number of orthogonal basis functions:

$$u_i(r) = \sum_{k=1}^{K_0} a_k^{(i)} f_k(r) \quad i = 1, 2 \ldots N_c \quad (11)$$

where $\{f_k(r), k=1, 2, \ldots K_0\}$ defines a set of basis functions, $\{a_k^{(i)}, k=1, 2, \ldots K_0\}$ are the unknown coefficients for the ith coil, and $K_0$ is the number of unknowns from one coil. Since the weighting function is smooth, only low-order basis functions and a few unknowns are needed during image reconstruction. Various basis functions can be used in Eq. (11); examples of such basis functions are used in the above-noted BOSCO.

The convolution model of GRAPPA reconstruction works well for Cartesian partially parallel imaging. When data is sampled along Cartesian trajectories in k-space, the shift and direction between the missing lines and the acquired ACS lines are consistent throughout k-space. Therefore, the weighting coefficients estimated from the low-frequency region can be applied for reconstructing missing lines in the high frequency region. When data is acquired along non-Cartesian trajectories in k-space, however, this geometric consistency of the k-space sampling pattern does not exist anymore. Consequently, it is not straightforward to apply the GRAPPA convolution process for non-Cartesian partially parallel imaging.

In the above-noted. BOSCO, it has been demonstrated that it is possible to reconstruct the unaliased image using the convolution model described in Eq. (1) with small and non-constrained convolution kernels after gridding the k-space data onto Cartesian grids. Based on BOSCO theory, we can derive the same reconstruction process for non-Cartesian partially parallel imaging after the k-space data are interpolated onto Cartesian grids using gridding. Similarly to GRAPPA, BOSCO is a coil-by-coil reconstruction method where unaliasing is performed on each coil and the final image is the combination of unaliased coil images. The preferred embodiment therefore has significant computational advantages compared to BOSCO when a large number of coils are used for non-Cartesian parallel imaging, which is valuable when fast image reconstruction is necessary, such as for real-time imaging.

The full FOV composite image can be formed as a linear combination of aliased component coil images, as shown in Eq. (3). One concern of the present invention is whether the coefficients estimated using the low resolution images from training process can also be applied to form the final high resolution full FOV composite image. This is true if the following assumptions are satisfied: a) the weighting coefficients given in Eq. (3) are smooth in space, and b) the weighting coefficients given by Eq. (9) are smooth in space. Assumption a) is valid, since these coefficients generally reflect the sensitivity profiles, which are smooth in space. Assumption b) generally is valid, since these coefficients reflect the product of two smooth functions in space.

FIG. 1 shows an example of hardware on which the preferred embodiment or another embodiment can be implemented. The system 100 images a region of interest ROI using multiple coils 102. A processor 104 receives raw image data from the coils and processes them as disclosed herein to produce the full final FOV image. The image is output to an output 106, which can include one or more of a display, a printer, persistent storage, and a communication device for transmitting the full final FOV image to a remote location. Software for implementing the preferred embodiment or another embodiment can be supplied on any suitable machine-readable medium 108. It is contemplated that the image reconstruction will be performed in real time or near real time, although as an alternative, the raw image data could be taken and stored for later processing.

Figure 2:
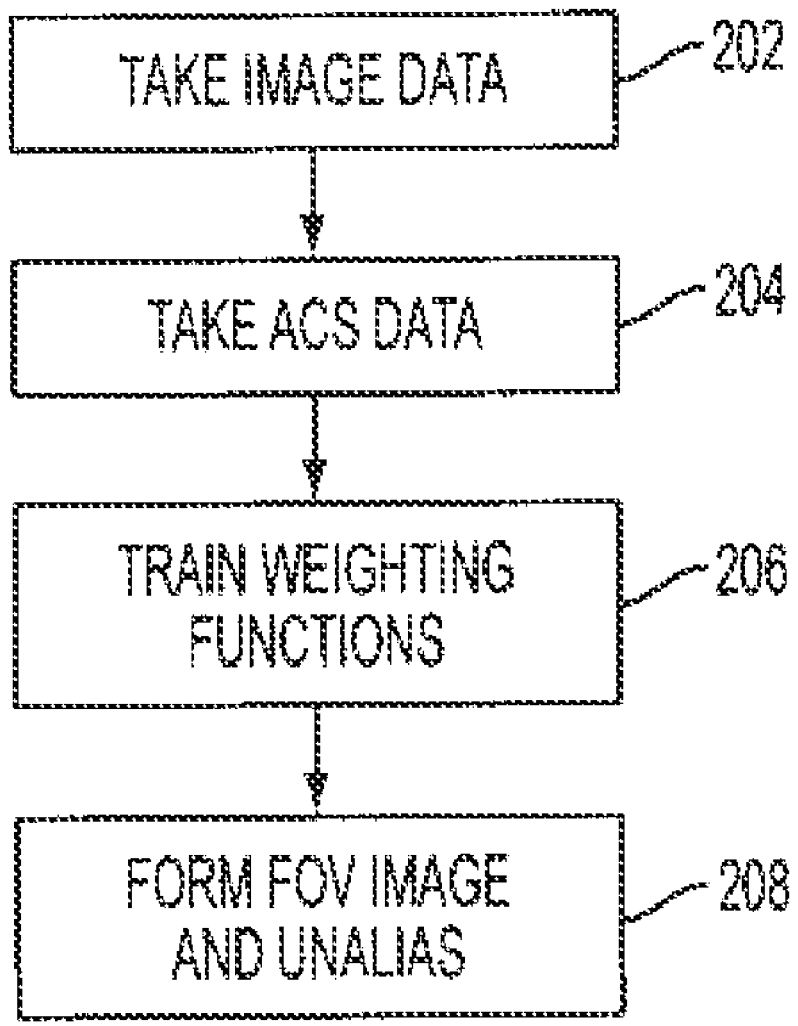
FIG. 2 is a flow chart showing process steps in the preferred embodiment.

FIG. 2 shows an overview of the process. Under-sampled raw image data are taken in step 202. In step 204, ACS data are taken. The weighting functions are trained in step 206 and used to form and unalias the final full-FOV image in step 208.

Experimental results will now be described. The data sets were acquired from a Siemens 1.5 T Avanto scanner. For Cartesian acquisitions, the data sets were acquired using a turbo spin echo (TSE) sequence. Data sets were acquired using 2×, 3×, and 4× acceleration factors, with 26, 33, and 35 ACS lines, respectively. The preferred embodiment has also been tested for spiral parallel reconstruction. The technique has been applied for both dual density spiral and constant density spiral acquisitions. For dual density spiral acquisition, the center region of k-space is fully sampled, and the outer region is under-sampled. The fully sampled center region is used as the training target. For constant density spiral acquisition, full FOV data sets are acquired and spiral interleaves are decimated to simulate various acceleration factors. The center of k-space is kept fully sampled for constant density spiral and used as the training target.

We compared the preferred embodiment to BOSCO reconstruction. Both algorithms were implemented in Matlab (MathWorks Inc., Natick, Mass.). The final high resolution composite images were reconstructed into a 512×512 image matrix. For Cartesian sampling, the size of the training matrix was the number of ACS lines times 512. For non-Cartesian sampling, the training data sets were gridded to 64 by 64 for the training process.

FIGS. 3A-3C, 4A-4C and 5A-5C show a transverse scan of a resolution phantom data set acquired by the Cartesian TSE sequence with 2×, 3×, and 4× acceleration, respectively. The FOV was 28 cm, the slice thickness was 5 mm, and TR/TE were 600/98 ms. A head coil with 6 elements was placed around the phantom for data acquisition.

Figure 3A:
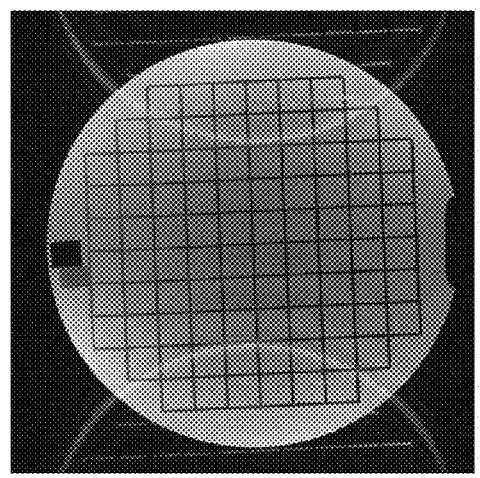
FIGS. 3A-3C show image data from parallel reconstruction of a phantom data set acquired using a Cartesian TSE sequence with 2× acceleration.
Figure 3B:
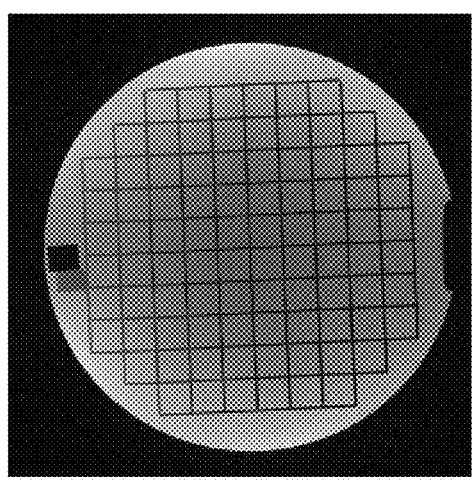
Figure 3C:
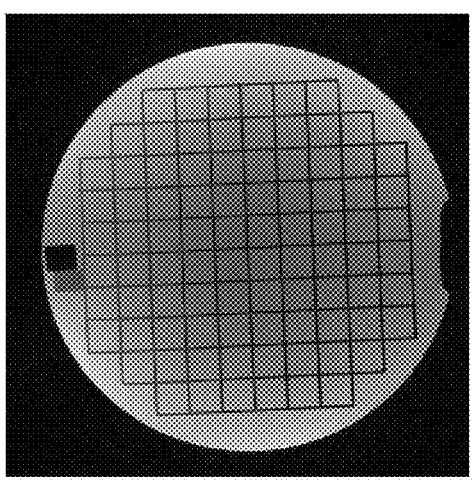

FIGS. 3A-3C show parallel reconstruction of a phantom data set acquired using a Cartesian TSE sequence with 2× acceleration in which 26 ACS lines are acquired. FIG. 3A shows the square root of the sum of squares of images after direct Fourier transform. FIG. 3B shows the image reconstructed using BOSCO. FIG. 3C shows the image reconstructed using the preferred embodiment.

Figure 4A:
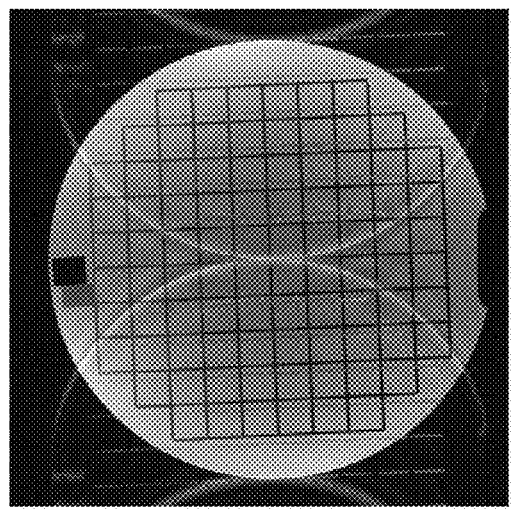
FIGS. 4A-4C show image data from parallel reconstruction of a phantom data set acquired using a Cartesian TSE sequence with 3× acceleration.
Figure 4B:
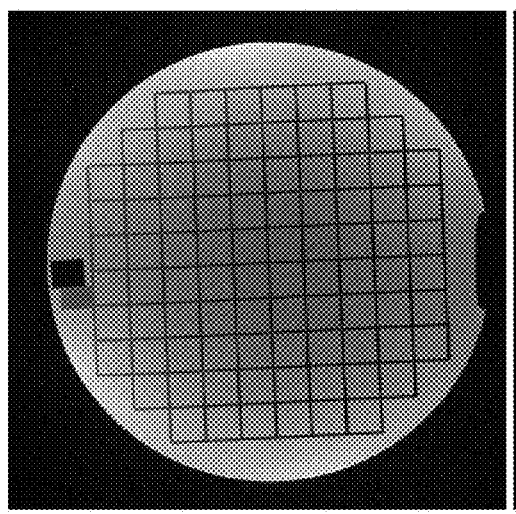
Figure 4C:
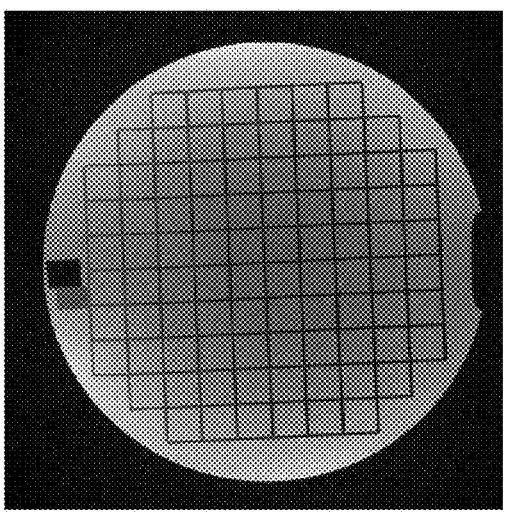

FIGS. 4A-4C show parallel reconstruction of a phantom data set acquired using a Cartesian TSE sequence with 3× acceleration in which 33 ACS lines are acquired. FIG. 4A shows the square root of the sum of squares of images after direct Fourier transform. FIG. 4B shows the image reconstructed using BOSCO. FIG. 4C shows the image reconstructed using the preferred embodiment.

Figure 5A:
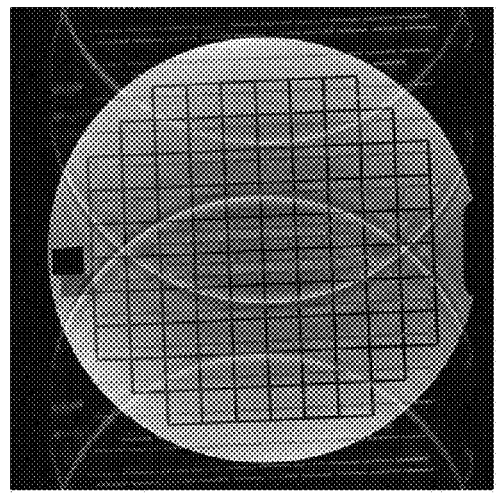
FIGS. 5A-5C show image data from parallel reconstruction of a phantom data set acquired using a Cartesian TSE sequence with 4× acceleration.
Figure 5B:
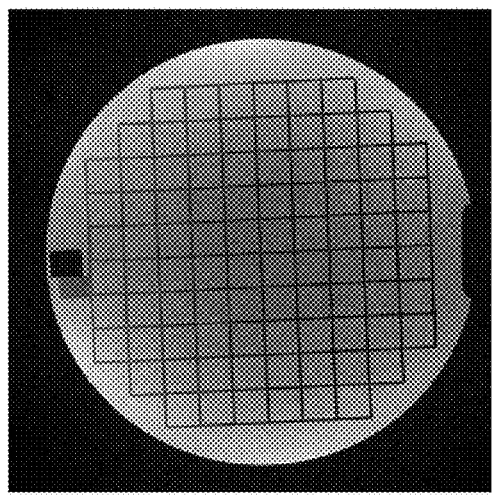
Figure 5C:
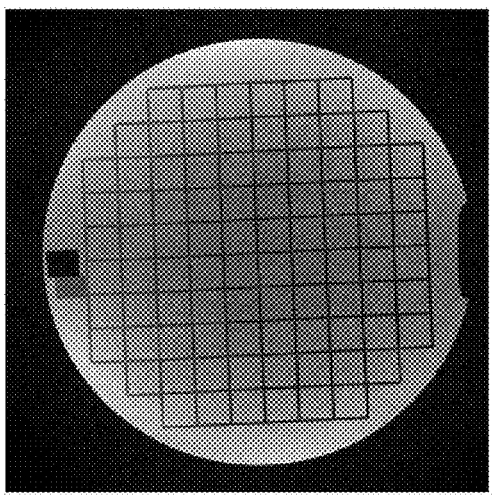

FIGS. 5A-5C show parallel reconstruction of a phantom data set acquired using a Cartesian TSE sequence with 4× acceleration in which 35 ACS lines are acquired. FIG. 5A shows the square root of the sum of squares of images after direct Fourier transform. FIG. 5B shows the image reconstructed using BOSCO. FIG. 5C shows the image reconstructed using the preferred embodiment.

The images reconstructed by the preferred embodiment and BOSCO are comparable. Aliasing artifacts become obvious at 4× acceleration for this example.

FIGS. 6A-6D, 7A-7D and 8A-8D show a transverse slice of an in vivo head scan of a healthy volunteer using the same Cartesian TSE sequence with 2×, 3×, and 4× acceleration, respectively. The FOV was 28 cm, the slice thickness was 5 mm, and TR/TE were 4000/99 ms. A head coil with 12 elements was placed around the head for data acquisition.

Figures 6A, 6B, 6C, 6D:
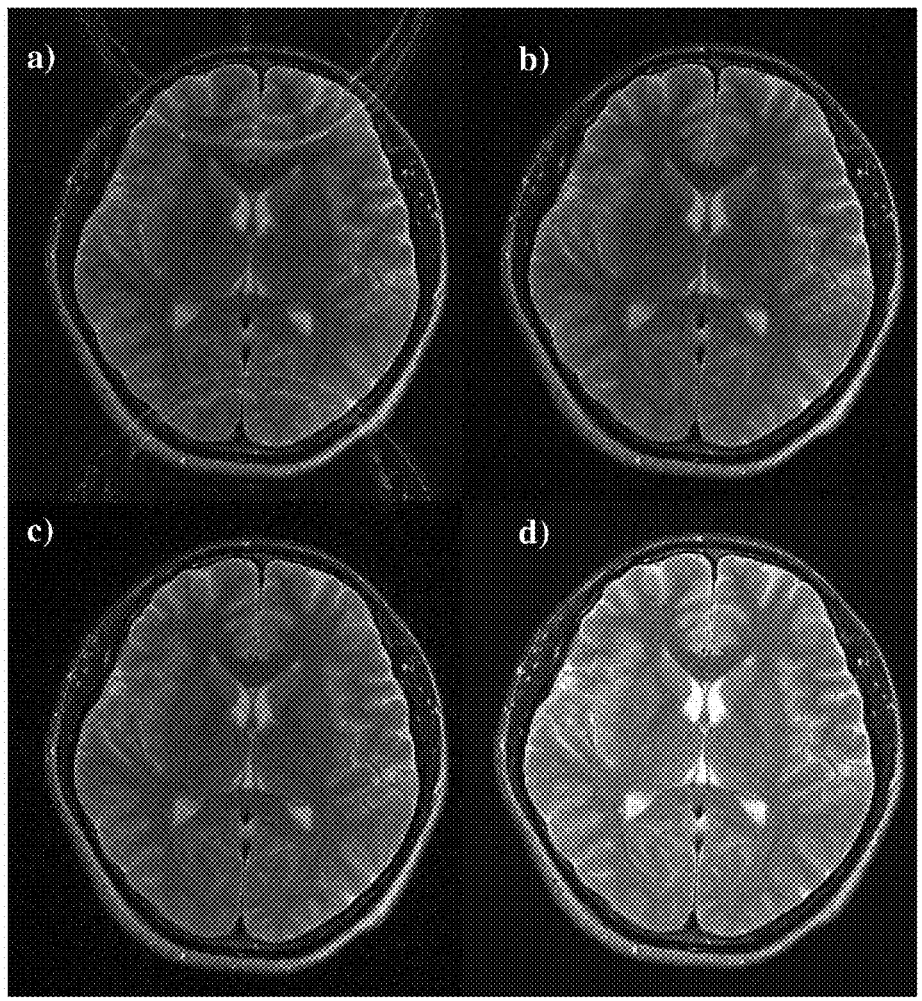
FIGS. 6A-6D show image data from an in vivo head scan acquired with 2× acceleration.
Figures 7A, 7B, 7C, 7D:
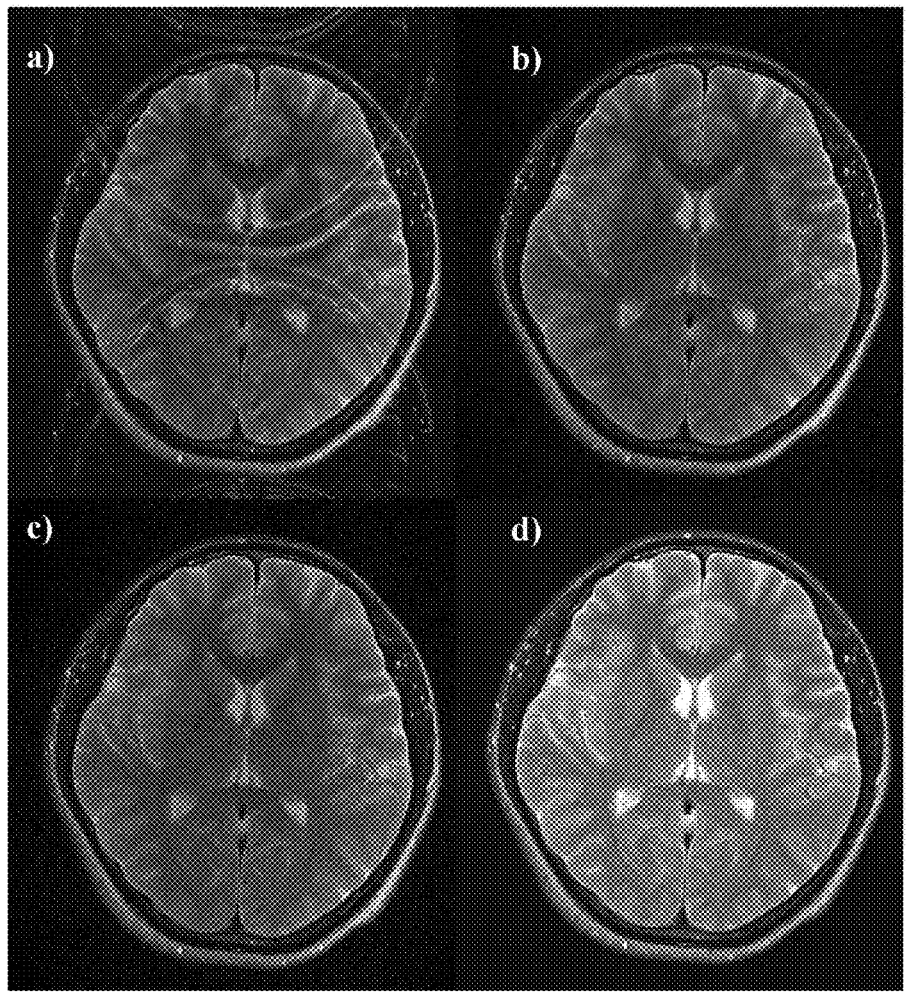
FIGS. 7A-7D show image data from an in vivo head scan acquired with 3× acceleration.
Figures 8A, 8B, 8C, 8D:
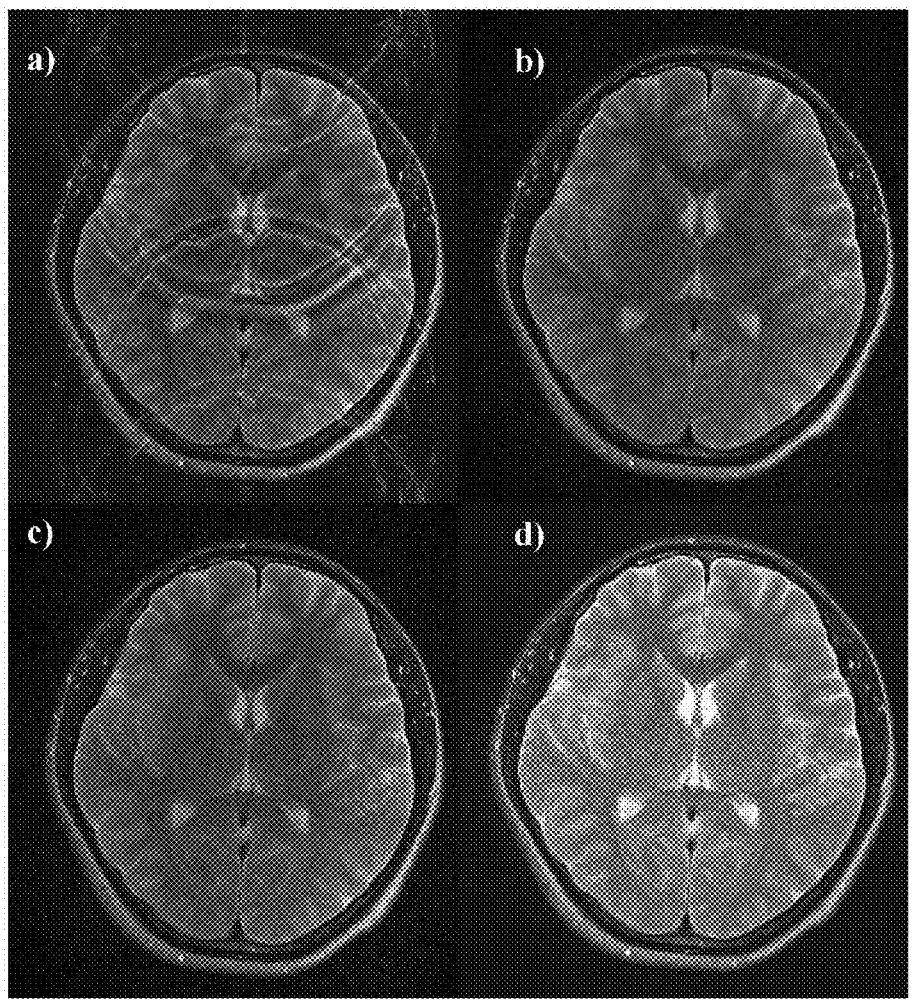
FIGS. 8A-8D show image data from an in vivo head scan acquired with 4× acceleration.

FIGS. 6A-6D show an in vivo head scan acquired with 2× acceleration. The data set was acquired with Cartesian sampling in k-space using a TSE sequence. FIG. 6A shows the square root of the sum of squares of images after direct Fourier transform of the acquired data. FIG. 6B shows BOSCO reconstruction. FIG. 6C shows reconstruction using the preferred embodiment. The preferred embodiment achieves comparable reconstruction to BOSCO, but with significantly reduced computational cost. FIG. 6D shows reconstruction using commercial GRAPPA. The image is exported directly from a Siemens scanner.

The images reconstructed by the preferred embodiment and BOSCO are comparable quality in terms of SNR and aliasing artifact reduction, and the preferred embodiment achieves considerable computational acceleration. Both methods remove aliasing artifacts successfully. Compared to the phantom example, the residual aliasing artifacts after unaliasing process are less obvious for this example at 4× acceleration. We also include the image reconstructed using GRAPPA provided by commercial Siemens scanner. These images are exported directly from the scanner computer. The difference between these images and the images we reconstructed using the preferred embodiment and BOSCO can be caused by the additional image processing provided by the Siemens scanner.

Figure 9A:
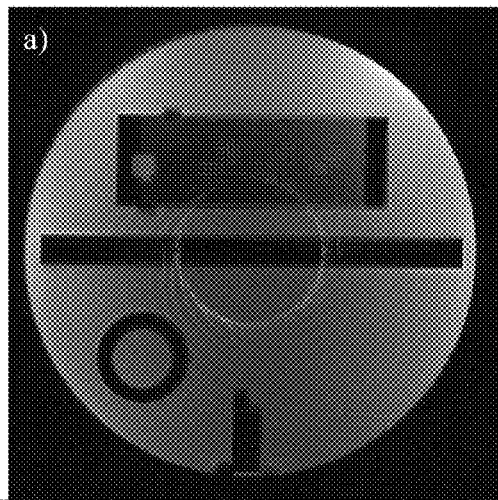
FIGS. 9A-9C show image data from parallel reconstruction of a resolution phantom data set acquired using dual-density spiral scanning with 2× acceleration.
Figures 9B, 9C:
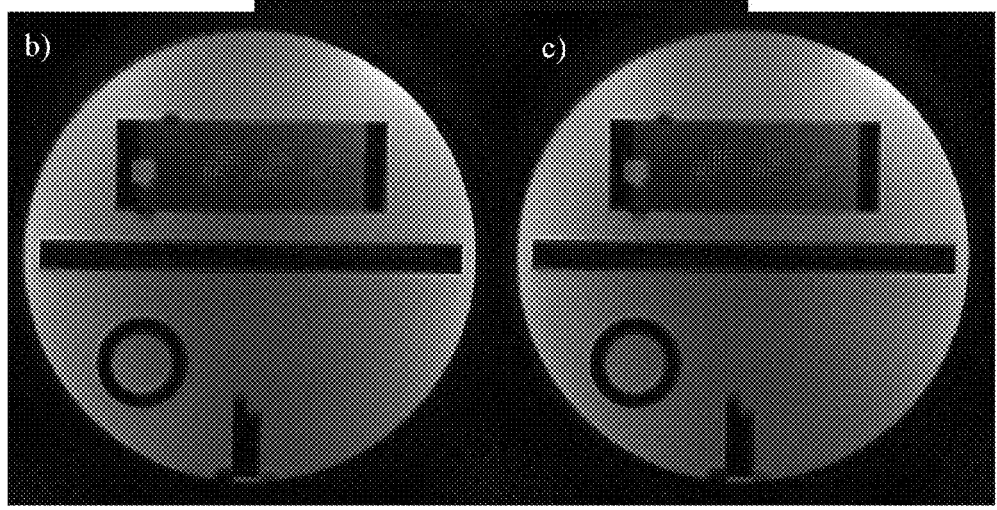

FIGS. 9A-C show a resolution phantom data set acquired using dual density spiral scanning with 2× acceleration. Sixteen interleaves were used for imaging data acquisition with 16.4 ms readout. The data set was acquired using a head coil with 6 receiver channels. FIG. 9A shows the image after gridding reconstruction. FIGS. 9B and 9C show images reconstructed using BOSCO and the preferred embodiment, respectively. Note that the two results are comparable for this example.

Figure 10A:
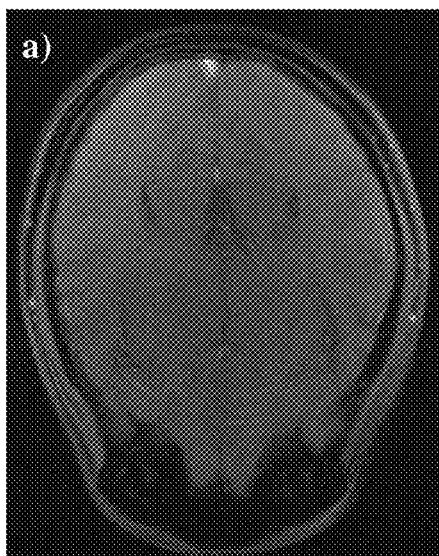
FIGS. 10A-10C show image data from parallel reconstruction of an in vivo 2× accelerated head scan of a healthy volunteer.
Figures 10B, 10C:
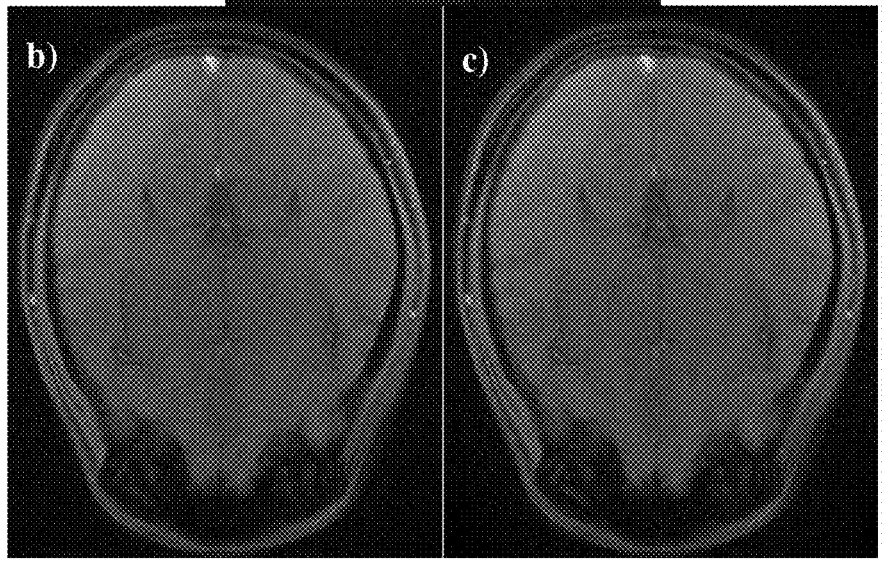

FIGS. 10A-10C show an in vivo 2× accelerated head scan of a healthy volunteer. The data set was acquired using a dual density spiral sequence. A head coil with 12 receiver channels was used for data acquisition. The k-space was sampled using 16 interleaves with a 16.4 ms read out to acquire this data set. The fully sampled center of k-space data set was used as the training target. FIG. 10A shows the image after gridding reconstruction on an under-sampled data set. Note the swirling aliasing artifacts inside FOV. FIGS. 10B and 10C show images reconstructed using BOSCO and the preferred embodiment, respectively. Note that the two results are comparable for this example. Both remove the aliasing artifacts.

While a preferred embodiment has been set forth in detail above, those skilled in the art who have reviewed the present disclosure will readily appreciate that other embodiments can be realized within the scope of the present invention. For example, numerical values are illustrative rather than limiting, as are recitations of specific hardware. Other variations have been noted above. Therefore, the present invention should be construed as limited only by the appended claims.

We claim:

1. A method implemented in a processing device for reconstruction of an image in a region of interest, the method comprising:
   (a) acquiring under-sampled raw image data from the region of interest into the processing device;
   (b) determining, in the processing device, weighting coefficients such that a sum of products of the weighting coefficients and the under-sampled raw image data will produce an unaliased full-field-of-view image of the region of interest;
   (c) multiplying, in the processing device, each of the weighting coefficients by a corresponding one of the under-sampled raw image data to produce a product; and
   (d) summing the products in the processing device to produce the unaliased full-field-of-view image of the region of interest.

2. The method of claim 1, wherein the under-sampled raw image data are acquired using a plurality of imaging coils.

3. The method of claim 2, wherein the unaliased full-field-of-view image represents an image taken with a single virtual coil.

4. The method of claim 3, where the single virtual coil is computed using an adaptive reconstruction method for signal-to-noise-ratio optimization in phased array imaging.

5. The method of claim 1, wherein the weighting coefficients are determined by acquiring additional calibration data by scanning k-space with variable density.

6. The method of claim 1, wherein the weighting coefficients are determined by acquiring additional auto-calibration signal lines.

7. The method of claim 1, wherein the weighting coefficients are determined by:
   (i) forming a composite full-field-of-view low-resolution image of the region of interest;
   (ii) forming a weighted sum of aliased low-resolution images from the plurality of imaging coils;
   (iii) determining a function of a difference between the composite full-field-of-view low-resolution image and the weighted sum of the aliased low-resolution images; and
   (iv) selecting the weighting coefficients to minimize the function.

8. The method of claim 7, wherein the full-field-of-view low-resolution image is reconstructed by combining full-field-of-view low-resolution coil images.

9. The method of claim 7, wherein the function is a least square norm.

10. The method of claim 7, wherein each of the weighting functions is a combination of a finite number of orthogonal basis functions.

11. The method of claim 1, wherein the under-sampled raw image data are Cartesian image data.

12. The method of claim 1, wherein the under-sampled raw image data are non-Cartesian image data.

13. The method of claim 12, wherein the non-Cartesian image data are gridded.

14. A system for reconstruction of an image in a region of interest, the system comprising:
   an image acquisition component for acquiring under-sampled raw image data from the region of interest;
   a processing device, in communication with the image acquisition component to receive the under-sampled raw image data, for determining weighting coefficients such that a sum of products of the weighting coefficients and the under-sampled raw image data will produce an unaliased full-field-of-view image of the region of interest, multiplying each of the weighting coefficients by a corresponding one of the under-sampled raw image data to produce a product, and summing the products in the processing device to produce the unaliased full-field-of-view image of the region of interest; and
   an output device, in communication with the processing device to receive the unaliased full-field-of-view image, for outputting the image reconstructed by the processing device.

15. The system of claim 14, wherein the image acquisition component comprises a plurality of imaging coils.

16. The system of claim 15, wherein the processing device is configured to reconstruct the unaliased full-field-of-view image as an image taken with a single virtual coil.

17. The system of claim 16, where the processing device is configured to compute the single virtual coil using an adaptive reconstruction method for signal-to-noise-ratio optimization in phased array imaging.

18. The system of claim 14, wherein the processing device is configured to determine the weighting coefficients by acquiring additional calibration data by scanning k-space with variable density.

19. The system of claim 14, wherein the processing device is configured to determine the weighting coefficients by acquiring additional auto-calibration signal lines.

20. The system of claim 14, wherein the processing device is configured to determine the weighting coefficients by:
   (i) forming a composite full-field-of-view low-resolution image of the region of interest;
   (ii) forming a weighted sum of aliased low-resolution images from the plurality of imaging coils;
   (iii) determining a function of a difference between the composite full-field-of-view low-resolution image and the weighted sum of the aliased low-resolution images; and
   (iv) selecting the weighting coefficients to minimize the function.

21. The system of claim 20, wherein the processing device is configured to reconstruct the composite full-field-of-view low-resolution image by combining full-field-of-view low-resolution coil images.

22. The system of claim 20, wherein the processing device is configured such that the function is a least square norm.

23. The system of claim 22, wherein the processing device is configured such that each of the weighting functions is a combination of a finite number of orthogonal basis functions.

24. The system of claim 14, wherein the image acquisition component is configured to acquire the under-sampled raw image data as Cartesian image data.

25. The system of claim 14, wherein the image acquisition component is configured to acquire the under-sampled raw image data as non-Cartesian image data.

26. The system of claim 25, wherein the processing device is configured to grid the non-Cartesian image data.

* * * * *